United States Patent [19]

Holloway

[11] Patent Number: 4,484,149
[45] Date of Patent: Nov. 20, 1984

[54] SINGLE-SUPPLY IC DIGITAL-TO-ANALOG CONVERTER FOR USE WITH MICROPROCESSORS

[75] Inventor: Peter R. Holloway, Andover, Mass.

[73] Assignee: Analog Devices, Inc., Norwood, Mass.

[21] Appl. No.: 327,921

[22] Filed: Dec. 7, 1981

Related U.S. Application Data

[62] Division of Ser. No. 120,892, Feb. 12, 1980, Pat. No. 4,323,795.

[51] Int. Cl.$^3$ .............................................. H03F 1/34
[52] U.S. Cl. .................................... 330/291; 330/297
[58] Field of Search ............... 330/262, 263, 267, 291, 330/297, 293, 110

[56] References Cited

U.S. PATENT DOCUMENTS

| 4,087,759 | 5/1978 | Iwamatsu | 330/262 |
| 4,236,120 | 11/1980 | White | 330/297 |
| 4,286,227 | 8/1981 | Sato | 330/267 |

Primary Examiner—James B. Mullins
Assistant Examiner—G. Wan
Attorney, Agent, or Firm—Parmelee, Bollinger & Bramblett

[57] ABSTRACT

A single-chip 8-bit DAC with bipolar current sources, an output buffer amplifier for developing an output voltage, a regulated reference for producing a calibrated output, and operated by a single-voltage supply, e.g. +5 volts. The buffer amplifier includes means providing for driving the output voltage virtually to ground level when the DAC output is zero. The current sources comprise a single-transistor cell driven by an I²L flip-flop circuit, and the reference supply is merged with the reference transistor circuit regulating the DAC current levels, both aiding in reducing required chip area. A highly efficient bias network is utilized to supply the high-level bias currents required.

6 Claims, 9 Drawing Figures

$$EFFICIENCY = \frac{I_{CC}}{I_a + I_b + I_c} = 100\%$$

SINGLE-SUPPLY IC DIGITAL-TO-ANALOG CONVERTER FOR USE WITH MICROPROCESSORS

This is a division of application Ser. No. 120,892 filed Feb. 12, 1980, now U.S. Pat. No. 4,323,795.

BACKGROUND OF THE INVENTION

1. Field of the Invention

This invention relates to digital-to-analog converters. More particularly, this invention relates to monolithic converters that are especially adapted for operation with microprocessors, such as may be used in analog control systems.

2. Description of the Prior Art

A wide variety of digital-to-analog converters have been available now for some time. Such converters frequently employ current sources which are selectively-activated in accordance with a digital input signal. U.S. Pat. No. Re. 28,633 (Pastoriza) shows one highly successful converter design of that type. A more recent design is shown in U.S. Pat. No. 3,961,326 (Craven). Digital-to-analog converters also are employed in successive-approximation analog-to-digital converters such as disclosed in U.S. application Ser. No. 931,960 (Brokaw et al); the latter converter particularly is advantageous in that it incorporates inverted mode transistor circuitry (sometimes referred to as I²L, for "integrated injection logic"), together with bipolar transistor circuitry, on the same monolithic chip.

There have been proposals for converters especially suited for use with microprocessors, as for example described in the paper by Schoeff entitled "A Microprocessor Compatible High-Speed 8-Bit DAC", in the February, 1978, ISSCC Digest of Technical Papers, at pages 132–133.

Although many proposals have been put forward, none has provided a satisfactory converter capable of required performance, and yet suitably simple in design to be manufactured economically. Particularly, prior art designs have not provided a monolithic converter including a reference source and an amplifier to produce voltage output, all operable by a single supply, e.g. +5 volt. It is a principal object of this invention to provide solutions to the problems encountered in achieving that goal.

SUMMARY OF THE INVENTION

In accordance with one important aspect of the invention, there is disclosed herein a digital-to-analog converter incorporating a superior buffer amplifier capable of producing an output voltage between zero and some nominal value while operating from a single supply. In accordance with another aspect of the invention, there is provided a simplified one-transistor current-source cell capable of operation directly with I²L switching logic, to permit a significant reduction in part count of the chip. In still another aspect of this invention, a converter is provided having a novel simplified reference supply for regulating the gain of the current sources to stabilize the output current of the converter. In yet another aspect of the invention, a converter bias current network is provided having high efficiency, and thus reducing the required power while still achieving excellent performance.

Other objects, aspects and advantages of the invention will be pointed out in, or apparent from, the following detailed description of a preferred embodiment of the invention, considered together with the accompanying drawings.

DESCRIPTION OF A PREFERRED EMBODIMENT

Figure 1:
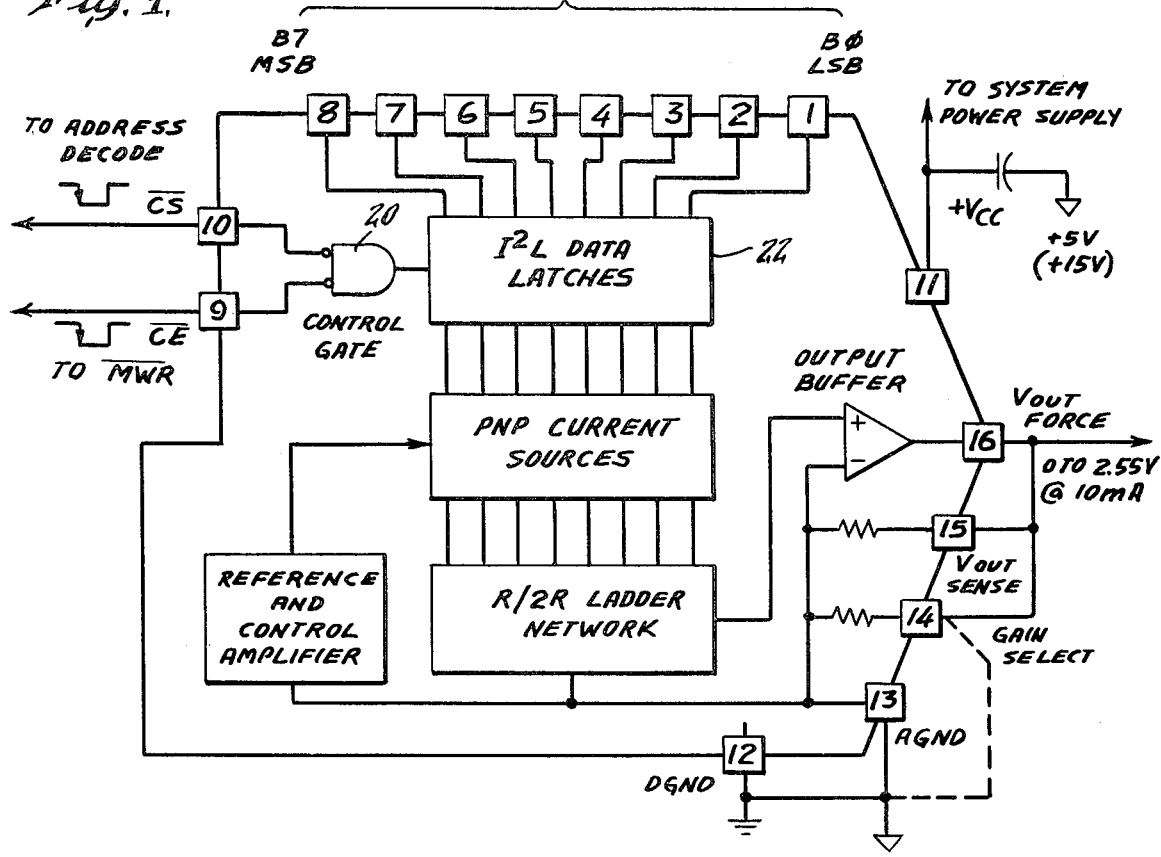
FIG. 1 is a block diagram illustrating the preferred embodiment.

Referring now to FIG. 1, the microprocessor logic control signals $\overline{CS}$ and $\overline{CE}$ are directed to a gate 20 which controls the I²L data latches generally indicated at 22. The latches are transparent to data on the data bus 24 when both $\overline{CE}$ and $\overline{CS}$ are at logic "∅". The input data is stored in the latches when either $\overline{CE}$ or $\overline{CS}$ goes to logic "1".

Figure 2A:
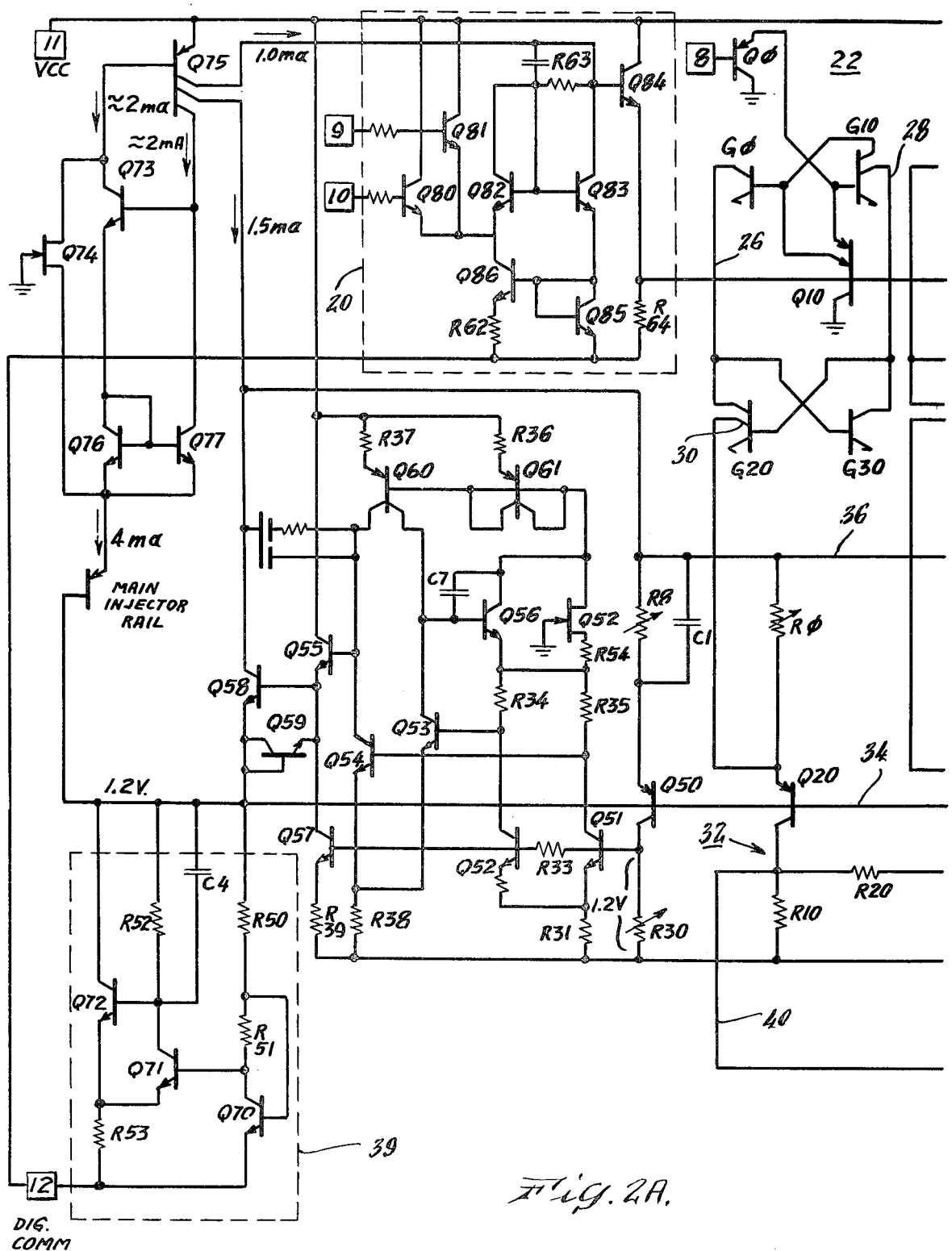
FIGS. 2A and 2B together present a detailed circuit diagram of the preferred embodiment.
Figure 2B:
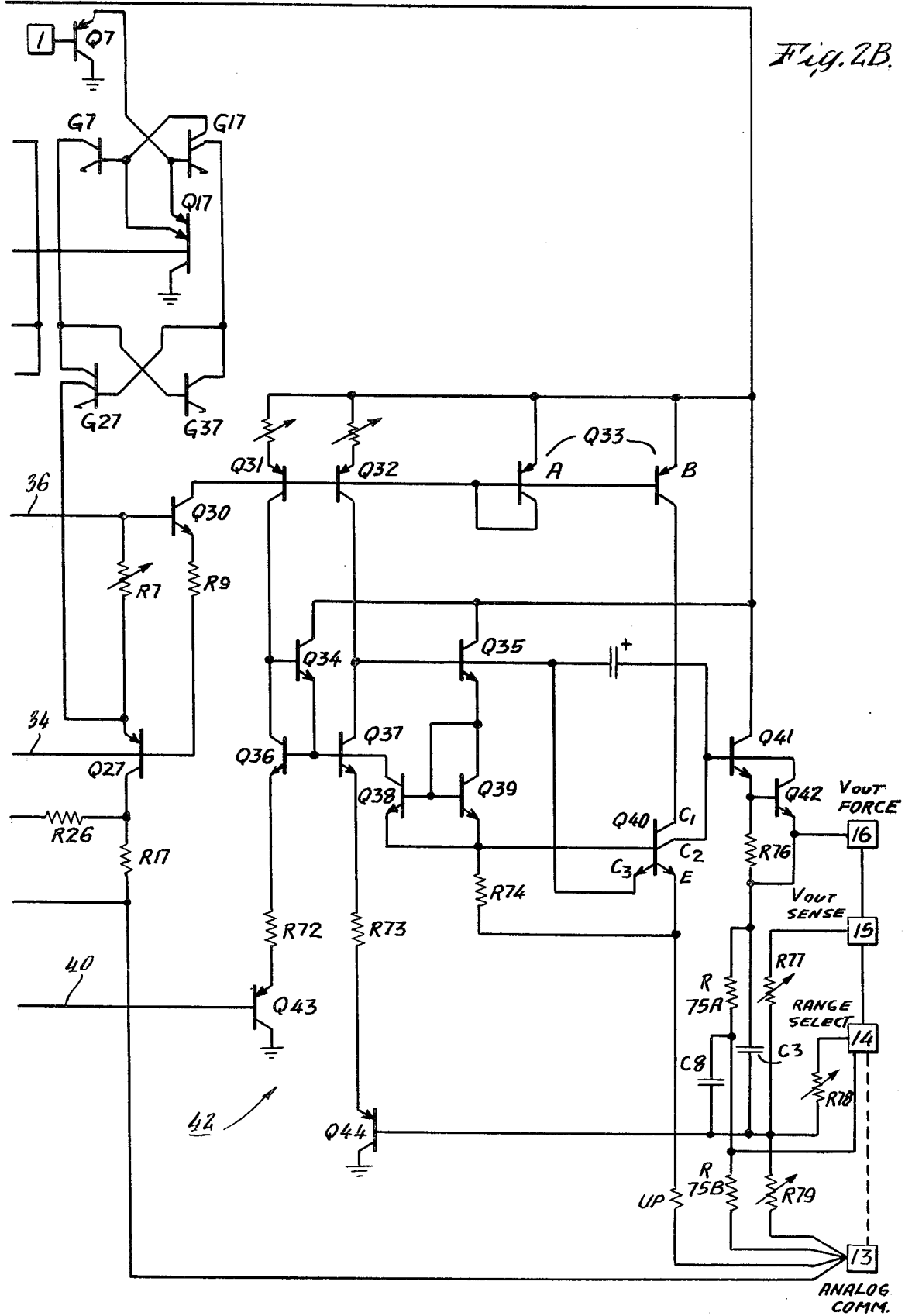

As shown in FIG. 2, the data latches 22 comprise eight I²L flip-flops G20/G30–C27/G37 (although for simplicity only the first and eighth are shown). The output of the control gate 20, which swings around 1.2 volts, is applied to the bases of eight transistors Q10–Q17 which act together with respective data input transistors Q0–Q7 to control the initially disabled I²L gate pairs G0/G10–G7/G17. Depending on the status of the input data, one or the other of the two gate lines 26, 28, etc., is pulled down to control the associated eight set/reset flip-flops G20/G30–G27/G37. If the left-hand flip-flop section (G20–G27) is turned on, current will flow through the associated collector 30, etc., connected to the emitter of a corresponding PNP current source transistor Q20–Q27. This current is drawn from the transistor emitter circuit, interrupting flow through the transistor to an R/2R ladder network generally indicated at 32, and which functions in the usual way to provide an analog output current corresponding to the binary input on the data bus 24.

Figure 3:
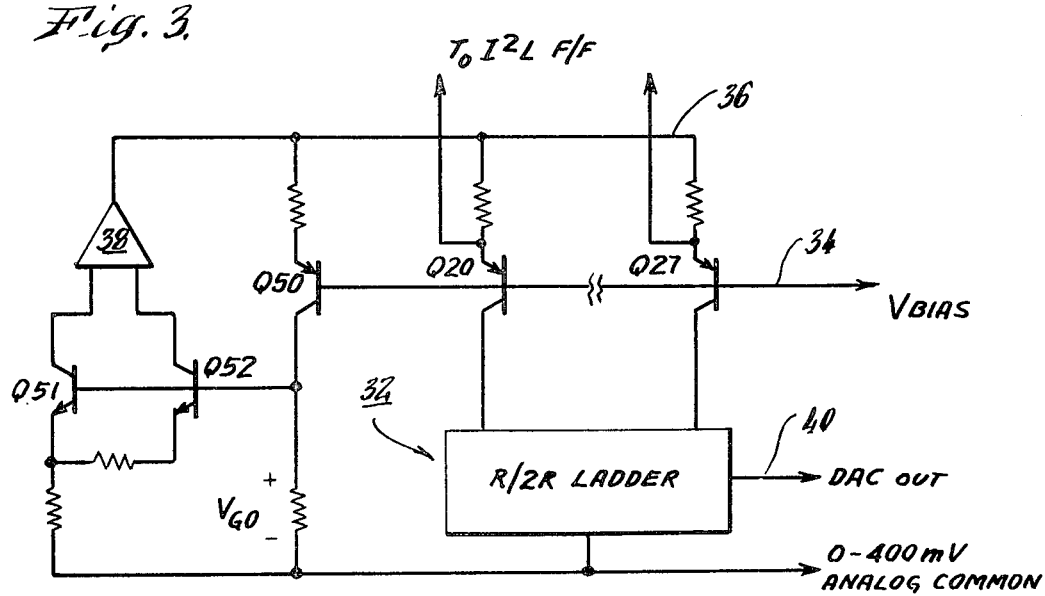
FIG. 3 is a diagrammatic presentation of the reference supply circuitry for the current sources.

Referring now in more detail to the current source transistors Q20–Q27, the voltage between the common base line 34 and the emitter-resistor rail 36 is controlled by a regulating reference source illustrated in simplified format in FIG. 3. This arrangement includes a band-gap cell of the type disclosed in U.S. Pat. No. 3,887,863 (Brokaw), having two transistors Q51 and Q52 with associated resistors R31 and R32 and operated at different current densities. As explained in that patent, the collector currents of the two transistors are sensed by an error amplifier 38. In the present arrangement, however, the amplifier output is directed to the emitter resistor rail 36 to which is connected a reference resistor R8 and a reference transistor Q50. These elements, together with another resistor R30, provide feedback to the bases of transistors Q51 and Q52, and drive the rail 36 to a voltage producing through R8 a feedback current which develops a voltage across R30 equal to the band-gap voltage ($V_{GO}$), e.g. essentially 1.205 V. for silicon. This sets the current through Q50 and all 8 DAC PNPs at a temperature independent 100 μA.

In the particular embodiment disclosed in FIG. 2, the differential error amplifier comprises Q53 and Q54, and a common emitter output amplifier Q58. The power supply rejection of the loop is enhanced by common-mode feedback through Q56, which fixes the collector base voltage of Q51 and Q52, and balances the error amplifier. A shunt regulator, generally indicated at 39 and of known design, biases the common base rail 34 at 1.2 V.

Figure 4:
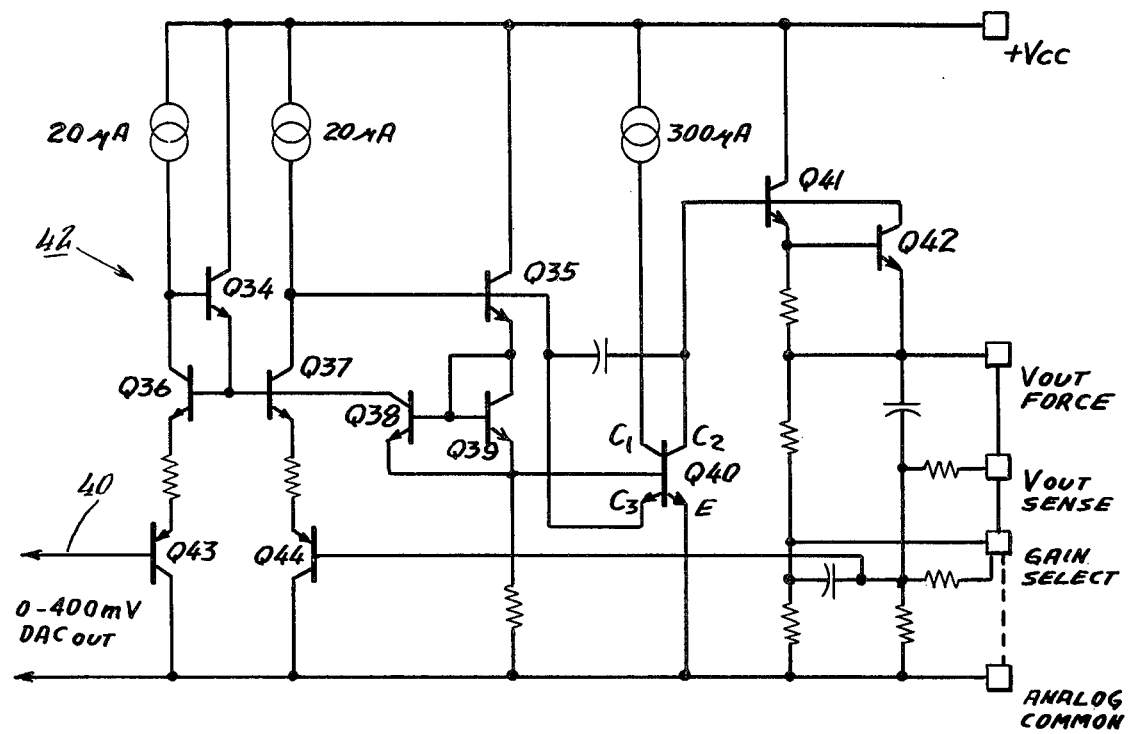
FIG. 4 shows aspects of the buffer amplifier.

Referring now to FIG. 4 together with FIG. 2, the output of the R/2R ladder 30 is directed along a line 40 to the output buffer amplifier generally indicated at 42 and including special features to accommodate the unipolar, ground referenced output swing of the R/2R ladder. This amplifier comprises a vertical PNP differential input pair Q43/Q44 with Q44 serving to provide a feedback signal corresponding to the amplifier output voltage. The ladder signal is coupled by Q43 up through a unique NPN current mirror circuit with transistors Q34–Q39. The signal passes from Q36 and Q34 to Q37 which drives Q35/Q39 controlling Q40, a special driver for the output emitter follower Q41 producing an output voltage at the $V_{OUT}$(FORCE) pin. This pin is connected to the $V_{OUT}$(SENSE) pin and to the Range Select pin for a 2.56 volt range. (Alternatively, the Range Select pin can be connected to analog common, to provide a 10 volt range.) The output voltage is fed back to the base of Q44, which functions to balance the signal from the R/2R ladder.

One of the principal problems in achieving a ground referenced output voltage swing in a single supply converter results from saturation in the output stage when the DAC signal level becomes very small, i.e. approaching zero, thus limiting the ability of the output stage to drive the output voltage down close to zero. In a normal amplifier, the consequent unbalance in the feedback causes the amplifier to tend to overdrive, thereby further intensifying the saturation problem. This problem has been solved by a special circuit arrangement now to be described.

Figure 7A:
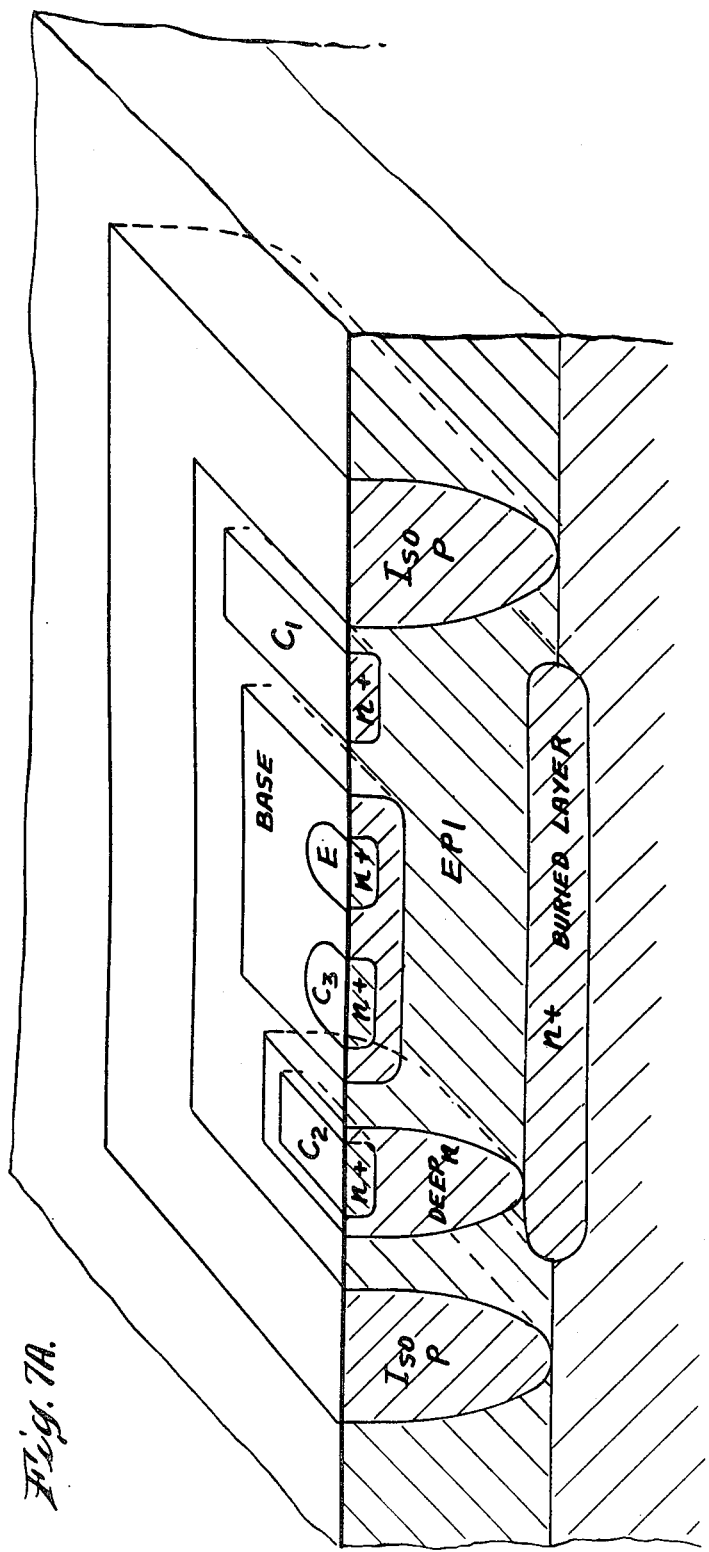
FIGS. 7A and 7B present a perspective section view of the structure of a drive transistor used in the buffer amplifier, and a schematic diagram of the elements of that transistor.
Figure 7B:
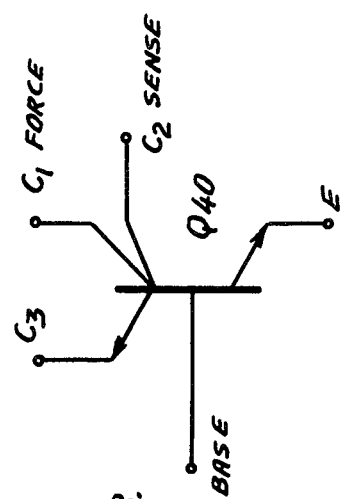

Referring also to FIG. 7, the output drive transistor Q40 includes the usual epitaxial layer, a collector $C_1$ (n+), and a base (p) having an emitter E (n+). In addition, the base is formed with a second n+ electrode labeled $C_3$, and shown as a second emitter in the circuit diagrams of FIGS. 2 and 4. This element is connected externally to the base of Q35. Normally, this element is not negative with respect to the base of Q40, so that no current will flow. However, as the amplifier output voltage gets close to zero, this element begins to serve as an inverted-mode collector (thus being labeled $C_3$), and collects current so as to limit the base drive at Q35. This prevents the saturation of Q40, and also controls the equilibrium points of the other transistors associated with Q35. In effect, the additional collector senses the onset of saturation in Q40, and operates through an interior feedback loop including Q35/Q39 to prevent further significant saturation while still developing the correct output signal. The result is that overload of the entire amplifier is prevented, and the output voltage can be driven down close to zero, even though only a signal supply voltage is employed.

In accordance with a further aspect of the invention, the output signal from Q40 preferably is developed from a separate collector $C_2$ formed in a deep n+ plug extending down to the buried layer. This Kelvin connection avoids the effects of the voltage drop across the internal resistance between the conventional collector $C_1$ and the buried layer.

Figure 5:
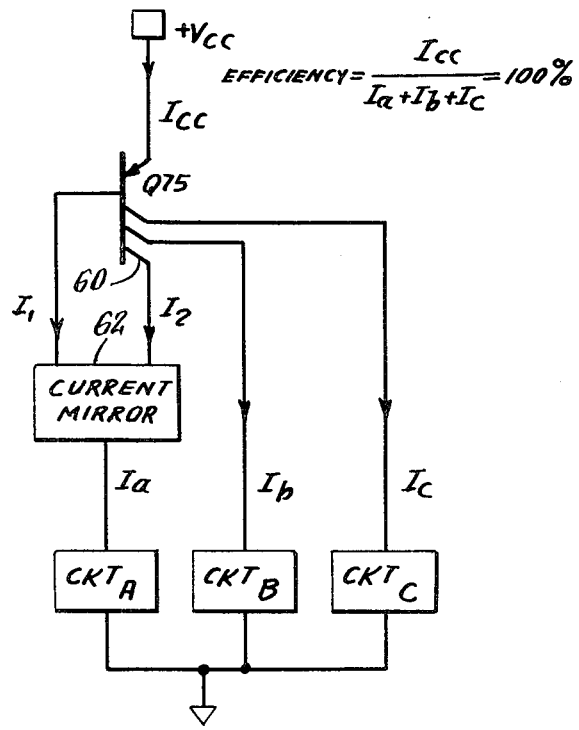
FIGS. 5 and 6 illustrate the functioning of the bias current network.
Figure 6:
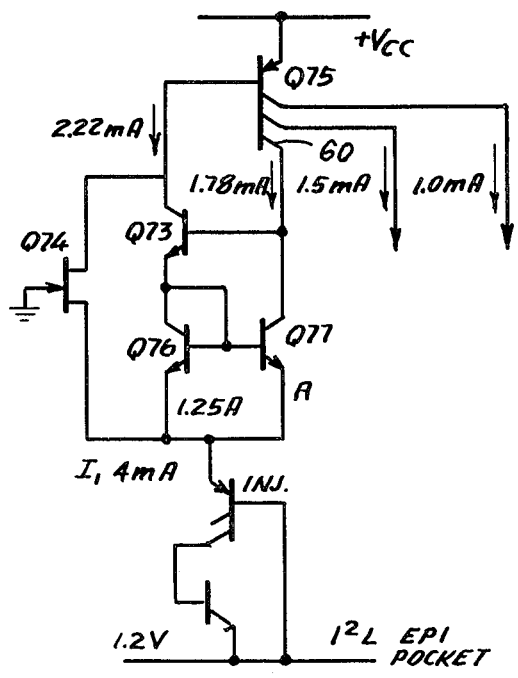

Referring now to FIGS. 5 and 6 as well as to the upper left-hand corner of FIG. 2A, the converter of this invention includes a unique highly efficient biasing network utilizing lateral PNPs developing the relatively high level currents required by the I²L circuitry, the ECL control gate 20 and the reference supply for the current sources Q20–Q27. The single bias supply transistor Q75 is formed with split collectors proportioned for the respective required bias currents, and is deliberately operated in high level injection. Under these conditions, $\beta$ and $I_c$ (total) form a constant product, i.e. $\beta I_{cT} = K$. One collector 60 is connected to a current mirror 62 also connected to the base of Q75. In more detail, as shown in FIG. 6, collector 60 is connected to the base of a feedback transistor Q73 the collector of which is connected to the base of Q75. The collector 60 and the emitter of Q75 are connected to a pair of transistors Q76 and Q77 having emitters with an area ratio of 1.25:1, to establish that ratio of currents therethrough. The combined current is delivered to the I²L main injector rail. (This rail is the more positive of the two supply connections to the I²L circuitry, and is connected to all of the I²L elements indicated schematically as half-arrow emitters; the more negative terminal is the buried layer.)

With the current mirror feedback shown, the base current $I_B$ for Q75 will be $\alpha I_{cT} M$, where $\alpha$ is the proportion of total collector current in collector 60, and M is the current mirror ratio. Since $\beta$ is defined as $I_{cT}/I_B$, it can be developed that $\alpha M = I_{cT}/K$, where K is the constant previously described, resulting from the initial device design characteristics. Thus, by properly adjusting $\alpha$ and M with reference to the requirements of the different circuit sections for bias currents, i.e. by fixing the relative areas of emitters of Q76 and Q77 and the split collectors of Q75, stable bias currents can be obtained for the individual circuit sections. Moreover, as will be apparent from FIG. 5, the circuit arrangement makes use of all of the current for biasing purposes, without loss. The circuit in effect recovers both the base current and the collector current of the feedback collector to be used as a current source for biasing purposes. FIG. 6 has been included alongside of FIG. 5 to permit ready comparison of the block diagram presentation with the actual circuitry.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

I claim:

1. In an IC electronic component of the type including an amplifier and signal-generating circuitry for developing a variable input signal for said amplifier; said amplifier having a signal-responsive drive transistor for producing an output signal varying in correspondence to said input signal; said component including power supply means comprising two supply terminals one of which is at a reference potential;

that improvement in such component for enabling said amplifier to be supplied with operating power only from said two power supply terminals and yet produce said output signal so that it faithfully varies with said input signal at any output level within a range of levels extending down to said reference potential; said improvement comprising:

means in said drive transistor for sensing the onset of saturation;

control signal means coupled to said sensing means for developing a control signal reflecting the degree of saturation in said drive transistor; and circuit means responsive to said control signal and operable automatically to adjust the drive signal applied to said drive transistor so as to reduce said saturation while providing for the development of said output signal at levels down to said reference potential without the detrimental changes in amplifier responsiveness which otherwise would result from uncontrolled saturation in the drive transistor.

2. Apparatus as claimed in claim 1, wherein said saturation sensing means comprises an additional electrode diffused into the semiconductive material of said drive transistor.

3. Apparatus as claimed in claim 2, wherein said drive transistor comprises a base diffusion into which is diffused an emitter electrode;

said additional electrode being diffused into said base.

4. Apparatus as claimed in claim 1, wherein said circuit means comprises negative feedback means operable to develop a feedback signal opposing the input signal to said drive transistor as the onset of saturation is detected by said sensing means.

5. Apparatus as claimed in claim 1, wherein said drive transistor comprises base, emitter and collector electrodes operable for controlling the currents within said transistor; and a separate collector forming part of said drive transistor for developing said output signal without the effects of the voltage drop across the internal resistance of the transistor.

6. Apparatus as claimed in claim 1, wherein said reference potential is ground.

* * * * *

UNITED STATES PATENT AND TRADEMARK OFFICE
CERTIFICATE OF CORRECTION

PATENT NO. : 4,484,149
DATED : November 20, 1984
INVENTOR(S) : PETER R. HOLLOWAY It is certified that error appears in the above—identified patent and that said Letters Patent is hereby corrected as shown below:

On the title page,

Re: Related U. S. Application Data

After "1980" Delete "Pat. No. 4,323,795"

Signed and Sealed this

Fourteenth Day of May 1985

[SEAL]

Attest:

DONALD J. QUIGG

Attesting Officer     Acting Commissioner of Patents and Trademarks